United States Patent [19]
Taira et al.

[11] Patent Number: 6,081,468
[45] Date of Patent: Jun. 27, 2000

[54] SEMICONDUCTOR DEVICE

[75] Inventors: Takashi Taira, Yokohama; Kimimasa Imai, Kawasaki, both of Japan

[73] Assignee: Kabushiki Kaisha Toshiba, Kawasaki, Japan

[21] Appl. No.: 09/353,856

[22] Filed: Jul. 15, 1999

[30] Foreign Application Priority Data

Jul. 17, 1998 [JP] Japan .................................. 10-203456

[51] Int. Cl.⁷ ................................ G11C 7/00; G11C 8/00
[52] U.S. Cl. ...................... 365/203; 365/230.03; 365/233
[58] Field of Search .............................. 365/203, 230.03, 365/233, 222, 226

[56] References Cited

U.S. PATENT DOCUMENTS

| | | | |
|---|---|---|---|
| 5,642,314 | 6/1997 | Yamauchi | 365/203 |
| 5,815,451 | 9/1998 | Tsuchida | 365/203 |
| 5,896,328 | 4/1999 | Tanizaki et al. | 365/203 |

FOREIGN PATENT DOCUMENTS 5-94694  4/1993  Japan .............................. G11C 11/41

*Primary Examiner*—Trong Phan
*Attorney, Agent, or Firm*—Hogan & Hartson LLP

[57] ABSTRACT

To suppress the power-on current flowing when power is tuned on in the circuit which feeds precharging current to the bit lines of the banks in a synchronous DRAM comprising a multi-bank structure. The device comprises a plurality of bank circuits BKi which are all of the same structure, wherein the bit line precharging power supply lines which the respective bank circuits have are connected in common, a first precharging power supply circuit which has its output node connected to the precharging power supply line and starts its precharging current feed operation when the power supply in the DRAM chip is turned on, and a second precharging power supply circuit which has its output node connected to the precharging power supply line and starts its precharging current feed operation after the bit line has been raised to a predetermined potential by the precharging current of the first precharging power supply circuit.

11 Claims, 8 Drawing Sheets

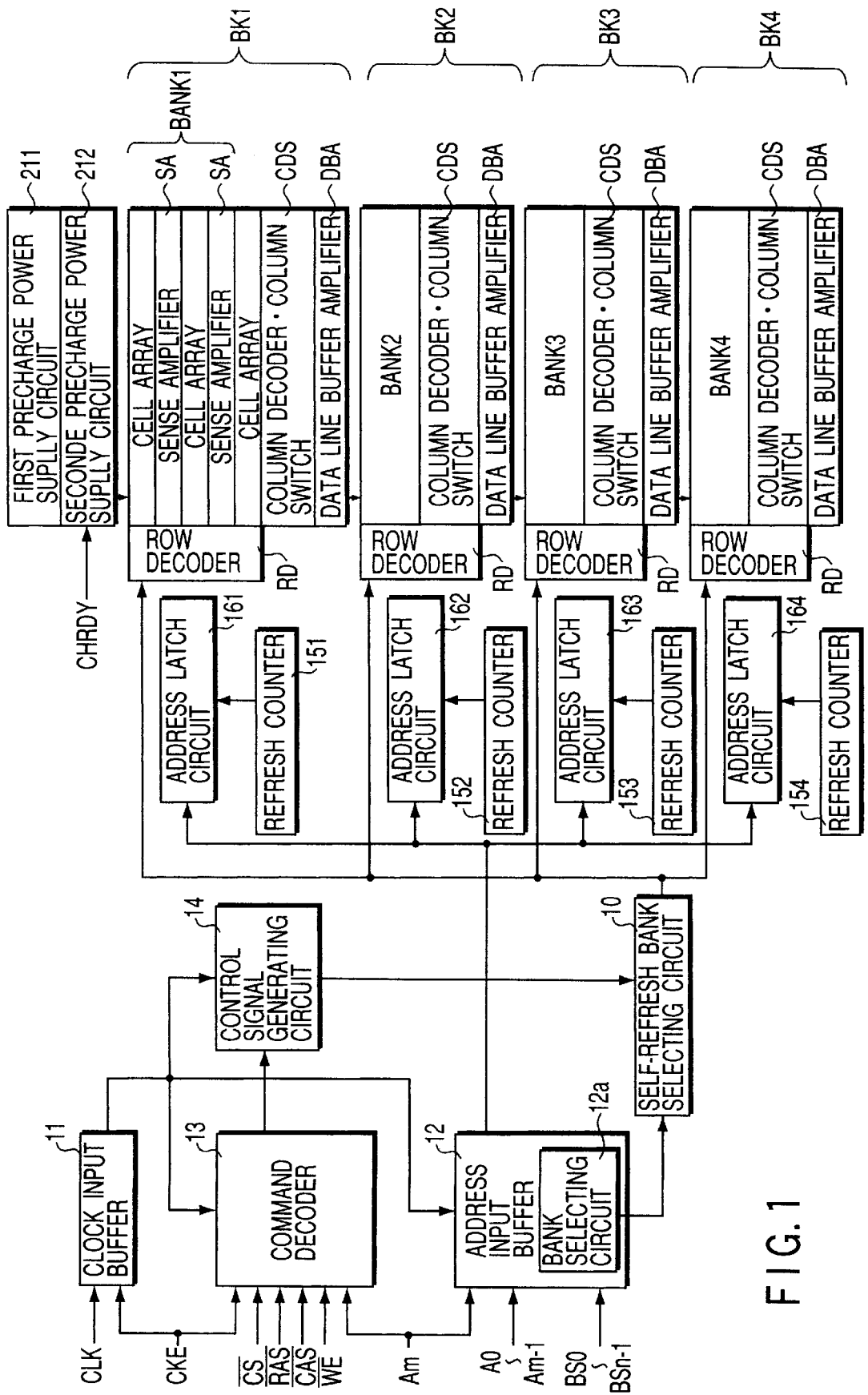
F I G. 1

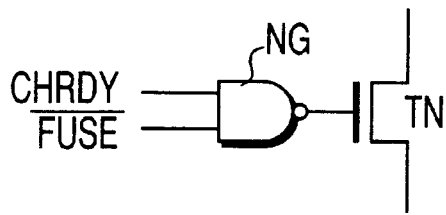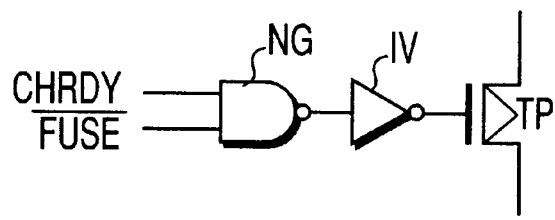
FIG. 9A  FIG. 9B
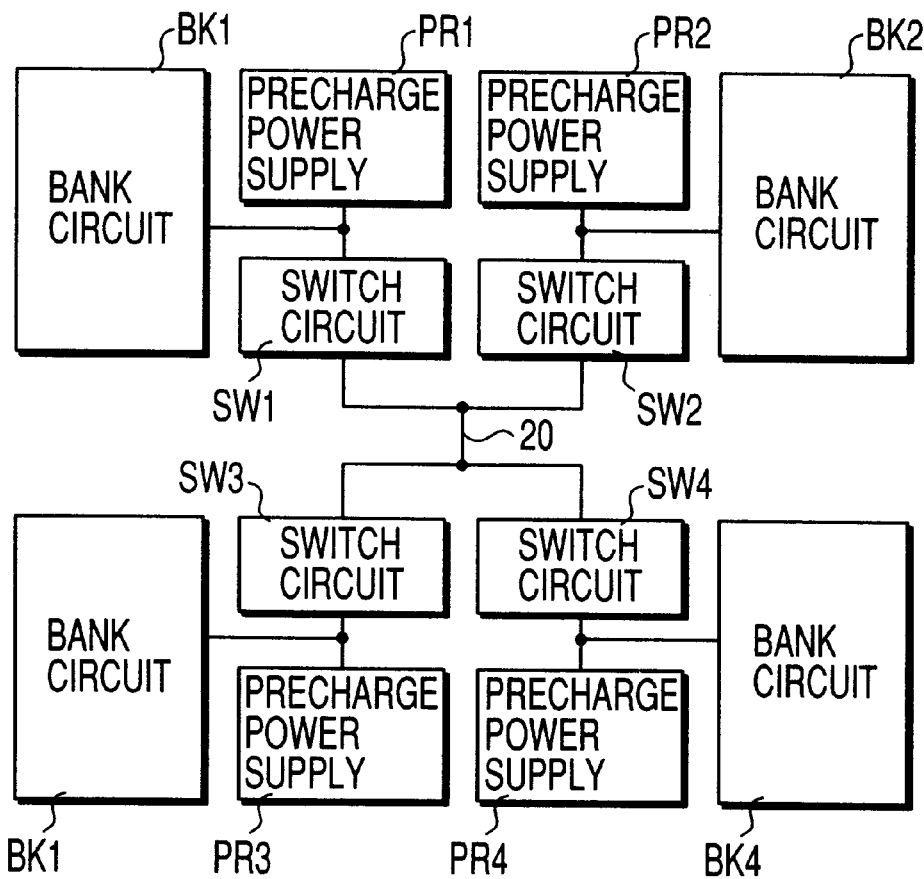
FIG. 10

SEMICONDUCTOR DEVICE

BACKGROUND OF THE INVENTION

The present invention relates to a semiconductor device and, more particularly, to a control circuit for controlling the operation, during power-on, of a power supply circuit which feeds a predetermined power to a plurality of circuit blocks which are all of the same structure, the above-mentioned semiconductor device being used as a synchronous dynamic random access memory (DRAM) which comprises a memory cell array divided into, for example, multi-banks.

FIG. 12 is an equivalent circuit diagram showing an example of the circuit connection between the banks and the precharging power supply circuit in a DRAM which has the conventional multi-bank structure.

In the DRAM shown in FIG. 12, the reference symbols, Bank1 to Bank4, denote banks, the symbol Gen denotes a precharging power supply circuit, the reference numeral 121 denotes a precharging power supply line for feeding a bit line precharging voltage (VBLEQ) to a bit line of each of Bank1 to Bank4, and numeral 122 denotes an earth potential (Vss) line. In this case, one precharging power supply circuit Gen is provided so as to feed a precharging current in common to the precharging power supply line 121.

FIG. 13 is a timing waveform diagram shown for explaining the precharging current feed operation of the precharging power supply circuit Gen shown in FIG. 12.

The precharging power supply circuit Gen feeds its precharging current fully to the respective banks when power is turned on but, during steady-state operation, feeds the precharging current supplementally to the bit lines; and thus, the current (power-on current) fed during power-on is large in amount, and the current fed a predetermined time after the power is turned on can be made relatively small in amount.

However, the operating power of the precharging power supply circuit Gen is the internal power Vint generated within the DRAM chip on the basis of the external power input. As mentioned above, if the precharging current when the power is turned on is large in amount, then the power-on current of the DRAM chip also becomes large in amount.

In case the power-on current of the DRAM chip is large in amount as mentioned above, the following inconvenience is brought about: That is, when power is turned on in a system product using a DRAM, the system power supply may be subjected to a voltage variation for causes such as a voltage drop in the wiring on the system board (mother board), which may in turn cause a malfunction when the system product is started.

Further, it is pointed out that, also in case the precharging power supply circuit Gen is divided into a plurality of precharging power supply circuits, the plurality of precharging power supply circuits simultaneously feed precharge currents, according to the conventional technique, when power is turned on as mentioned above, so that a defect as pointed out above is caused.

Further, in case of a DRAM comprising a multi-bank structure which is constituted in such a manner that the respective banks can be selected independently as, e.g., in case of a synchronous DRAM, the bit lines of the respective banks are connected in common according to the conventional technique, so that, during steady-state operation, the voltage variation caused in the bit line due to, for example, the bit line equalizing operation of a certain bank directly affects the bit lines of other banks (noises are generated due to the interference between the banks), thus adversely affecting the memory cell read operation.

In case of a conventional synchronous DRAM having a multi-bank structure, the following defects are encountered: That is, the power-on current is large in amount, so that a voltage variation is caused in the system power supply when power is turned on in a system product using the DRAM, as a result of which a malfunction is caused when the system product is started. Further, during steady-state operation, noise is apt to be generated due to the interference between the respective banks, which adversely affects the read operation of the memory cells.

BRIEF SUMMARY OF THE INVENTION

The semiconductor device according to a first aspect comprises a plurality of circuit blocks arranged in such a manner that precharging power supply lines which the circuit blocks have, respectively, are connected in common, and the circuit blocks are all of the same structure, a first precharging power supply circuit arranged in such a manner that a precharging current output node thereof is connected to the precharging power supply line, and the first precharging power supply circuit starts its precharging current feed operation when the power supply in the semiconductor chip is turned on, and a second precharging power supply circuit arranged in such a manner that a precharging current output node thereof is connected to the precharging power supply line, and the second precharging power supply circuit starts its precharging current supply operation after the precharging power supply line has been raised to a predetermined potential by the precharging current of the first precharging power supply circuit.

In a semiconductor device according to the first aspect of the present invention, the second precharging power supply circuit may comprise a reference voltage generation circuit which generates a first reference voltage on the basis of an external power supply input; a first transistor to which an internal voltage generated within the semiconductor chip on the basis of the external power supply input is fed as an operating power, the first transistor feeding a precharging current to the precharging power supply line; and a first comparison circuit to which the internal voltage is fed as an operating power, the first comparison circuit making a comparison between the first reference voltage and the voltage on the precharging power supply line upon receipt of a control signal generated after the precharging power supply line has risen to a predetermined potential and thus controlling the precharging current feed operation of the first transistor circuit in accordance with the resulting comparison output.

In a semiconductor device according to the first aspect of the present invention, the reference voltage generation circuit may further generate a second reference voltage which is larger than the first reference voltage, and the second precharging power supply circuit may further comprise a second transistor for discharging current from the precharging power supply line, and a second voltage comparison circuit which makes comparison between the second reference voltage and the voltage on the precharging power supply line to thereby control the discharge operation of the second transistor in accordance with the resulting comparison output.

In a semiconductor device according to the first aspect of the present invention, the pattern-wise positional relationship between the plurality circuit blocks and the precharging power supply circuits may be approximately symmetrical each circuit-block-wise.

In a semiconductor device according to the first aspect of the present invention, the semiconductor device may be a synchronous dynamic random access memory constituted in such a manner that the memory cell array and the circuits associated therewith are divided into a plurality of banks, which can be independently selected, and the precharging power supply lines of the respective banks may be the bit lines or capacitor plate lines of the cell array.

In a semiconductor device according to the first aspect of the present invention, the semiconductor device may further comprise:

a clock input buffer to which a clock signal and a control signal are inputted;

an address input buffer to which address signals and circuit block address signals are inputted, for amplifying the address signals and circuit block address signals in synchronism with an output signal from the clock input buffer, the address input buffer including a circuit block selection circuit which decodes an inputted circuit block address signal to generate a circuit block selection signal;

a command decoder to which external control signals are inputted as operation mode designating commands, the command decoder for decoding the external control signals in synchronism with the output signal from the clock input buffer;

a circuit block selection circuit in a self-refresh mode for receiving the circuit block selection signal outputted from the address input buffer and generating a circuit block selection signal in a self-refresh mode;

a control signal generation circuit to which an decode output signal outputted from the command decoder is inputted, for generating internal control signals in synchronism with the output signal from the clock input buffer;

refresh counters for generating refresh address signals; and address latch circuits which latch one of an output signal from the address input buffer and an output signal from the refresh counters, in accordance with whether the operation mode is a normal operation mode or a self-refresh mode.

The semiconductor device according to a second aspect comprises a plurality of circuit blocks which each have a precharging power supply line, a plurality of switch circuits which are provided corresponding to the plurality circuit blocks, each have one end thereof connected to the precharging power supply line of the corresponding circuit block, and are controlled into OFF state a predetermined time after the power supply in the semiconductor chip is turned on, a common precharging power supply line connected in common to the other ends of the polarity of switch circuits, and a plurality of precharging power supply circuits which are provided corresponding to the plurality of circuit blocks, and each have its precharging current output node connected to the precharging power supply line of the corresponding circuit block, wherein the plurality of precharging power supply circuits consist mixedly of first precharging power supply circuits which start their precharging current feed operation when the power supply in the semiconductor chip is turned on and of second precharging power supply circuits which start their precharging current feed operation after the precharging power supply lines have been raised to a predetermined potential by the precharging current from the first precharging current supply circuits.

In a semiconductor device according to the second aspect of the present invention, the pattern-wise positional relationship between the plurality circuit blocks and the precharging power supply circuits may be approximately symmetrical each circuit-block-wise.

In a semiconductor device according to the second aspect of the present invention, the semiconductor device may be a synchronous dynamic random access memory constituted in such a manner that the memory cell array and the circuits associated therewith are divided into a plurality of banks, which can be independently selected, and the precharging power supply lines of the respective banks may be the bit lines or capacitor plate lines of the cell array.

The semiconductor device according to a third aspect comprises a plurality of circuit blocks which each have a precharging power supply line, switch circuits which are connected at one-side ends thereof to the precharging power supply lines of specific first circuit block of the plurality of circuit blocks and connected in common at the other-side end thereof and are controlled into OFF state a predetermined time after the power supply in the semiconductor chip is turned on, a common precharging power supply line connected in common to the precharging power supply lines of the second circuit blocks other than the first circuit blocks and to the other-side ends of the switch circuits, a first precharging power supply circuit which has its precharging current output node connected to the precharging power lines of the first circuit blocks, and a second precharging power supply circuit which has its precharging current output node connected to the precharging power supply lines of the second circuit blocks, wherein, of the first precharging power supply circuit and the second precharging power supply circuit, one precharging power supply circuit starts its precharging current feed operation when the power supply in the semiconductor chip is turned on, while the other precharging power supply circuit starts its precharging current feed operation after the precharging power supply lines have been raised to a predetermined potential by the precharging current of the one precharging power supply circuit.

In a semiconductor device according to the third aspect of the present invention, the semiconductor device may be a synchronous dynamic random access memory constituted in such a manner that the memory cell array and the circuits associated therewith are divided into a plurality of banks, which can be independently selected, and the precharging power supply lines of the respective banks may be the bit lines or capacitor plate lines of the cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a part of the synchronous DRAM having a multi-bank structure according to a first embodiment of the present invention.

FIG. 9A is a circuit diagram showing an example of the switch circuits shown in FIG. 8.

FIG. 9B is a circuit diagram showing another example of the switch circuits shown in FIG. 8.

FIG. 10 is a pattern layout diagram showing an example of the positional relationship among the banks, the switch circuits and the precharging power supply circuits shown in FIG. 8.

DETAILED DESCRIPTION OF THE INVENTION

Figure 2:
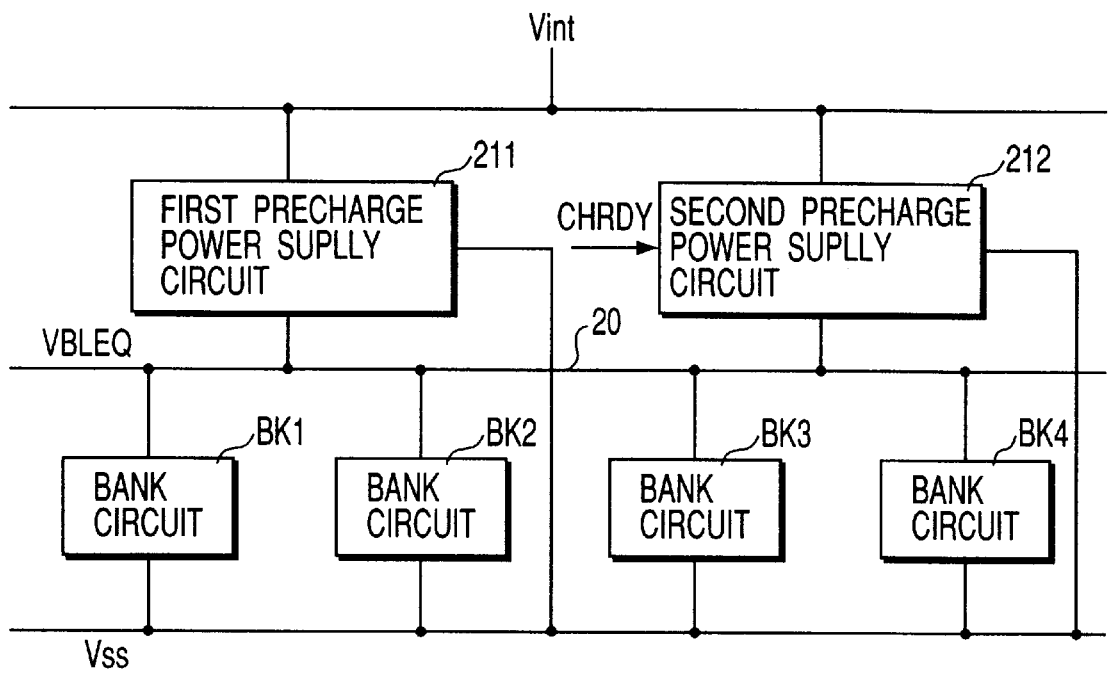
FIG. 2 is an equivalent circuit diagram showing an example of the circuit connection between the banks and the precharging current supply circuits shown in FIG. 1.

Embodiments of the present invention will now be described in detail by reference to the drawings.
<First Embodiment>

FIG. 1 shows a block diagram showing a part of the synchronous DRAM having a multi-bank structure according to a first embodiment of the present invention. In the first embodiment, the present invention is applied to a synchronous DRAM constituted in such a manner that the respective banks can be independently selected for refresh operation thereof. Referring to FIG. 1, the memory cell array is divided into a plurality of ("four" in this embodiment) bank memories Bank 1 to Bank 4.

A self-refresh bank selection circuit 10 is provided for generating a bank selection signal in a self-refresh mode. A clock input buffer 11 is a buffer to which a clock signal CLK and a control signal CKE are inputted.

An address input buffer 12 is a buffer to which address signals AO to Am−1, Am and bank address signals BSO to BSn−1 are inputted and which performs buffer amplification in synchronism with the output signal from the clock input buffer 11. The address input buffer 12 includes a bank selection circuit 12a which decodes the inputted bank address signals BSO TO Bsn−1 to generate a bank selection signal.

A command decoder 13, to which various external control signals (CKE signal, chip select signal /CS, row address strobe signal /RAS, column address strobe signal /CAS, write enable signal WE, and the most significant bit Am of the address signal) are inputted as operation mode designating command inputs, decodes them in synchronism with the output signal from the clock input buffer 11.

A control signal generation circuit 14, to which the decode output signal from the command decoder 13 is inputted, generates various internal control signals (including a self-refresh control signal) in synchronism with the output signal from the clock input buffer 11.

Numerals 151 to 154 denote four refresh counters which generate refresh address signals, respectively. Numerals 161 to 154 denote four address latch circuits, which latch the output signals (including the bank selection signal) from the address input buffer 12 or the output signals (refresh address signals) from the four refresh counters 151 to 154, respectively, in accordance with whether the operation mode under way is the steady-state operation mode or the self-refresh mode.

Circuits such as the row decoder RD, the bit line sense amplifiers SA, the column decoder/column switch CDS, the data buffer amplifier DBA are also respectively divided and disposed corresponding to the bank memories Bank1 to Bank4. In this case, the bit line sense amplifiers SA are divided so as to be disposed one in each cell block within the respective bank memories Bank1 to Bank4.

To the row decoders RD corresponding to the respective bank memories Bank1 to Bank4, the output signals from the respective address latch circuits 161 to 164 are inputted correspondingly. By the bank selection signal from the self-refresh bank selection circuit 10, it is controlled whether or not a decode operation may be performed by the respective row decoder RD, and thus, by the decode output signal, the row selection of the corresponding bank memory Bank1 to Bank4 is performed.

The column decoder/column Switches CDS corresponding to the respective bank memories Bank1 to Bank4 each decode the column address signal to perform the column selection in the corresponding bank memory Bank1 to Bank4.

The group consisting of one bank memory and the circuits such as the row decoder connected in association with the bank memory will hereinafter be referred to as a bank circuit BKi (i=1 to 4).

Numerals 211 and 212 denote a plurality of ("two" in this embodiment) precharging power supply circuits provided in common to the respective bank circuits BKi in order to feed precharging currents to the bit line precharging power supply lines of the respective bank memories Bank1 to Bank4.

In this case, a first precharging power supply circuit 211 is for starting the supply of a precharging current when power is turned on, while the other second precharging power supply circuit 212 is controlled in such a manner as to receive a control signal CHRDY a predetermined time after power is turned on and start to feed the precharging current.

FIG. 2 is an equivalent circuit diagram showing an example of the circuit connection between the four bank memories Bank1 to Bank4 and the two precharging power supply circuits 211, 212 shown in FIG. 1.

The respective bit line precharging power supply lines of the bank memories Bank1 to Bank4 are connected to a common connection line 20, and, connected to this common connection line 20 are the output node of the first precharging power supply circuit 211 and the output node of the second precharging power supply circuit 212.

Figure 3:
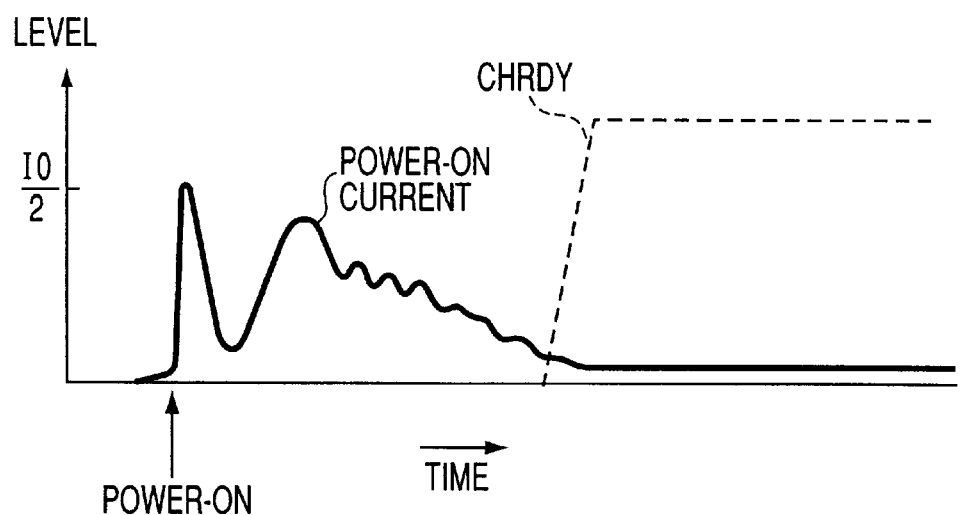
FIG. 3 is a timing waveform diagram for explaining the precharging current feed operation of the precharging power supply circuits in the synchronous DRAM according to the first embodiment of the present invention.

FIG. 3 is a timing waveform diagram for explaining the precharging current feed operation of the two precharging power supply circuits 211, 212 in the synchronous DRAM according to the first embodiment of the present invention.

That is, the synchronous DRAM according to the first embodiment is characterized by comprising a plurality of bank circuits BKi constituted in such a manner that the bit line precharging power supply lines which the bank circuits have, respectively, are connected to a common connection line 20, and the bank circuits BKi are all of the same structure, a first precharging power supply circuit 211 constituted in such a manner that the precharging current output node thereof is connected to the bit line precharging power supply lines, and the precharging power supply circuit 211 starts its precharging current supply operation when power is turned on in the DRAM chip, and a second precharging power supply circuit 212 constituted in such a manner that the precharging current output node thereof is connected to the bit line precharging power supply lines, and, after the bit lines have been raised to a predetermined potential by the precharging current from the first precharging power supply circuit 211, the second precharging power supply circuit 212 starts its precharging current supply operation.

According to the synchronous DRAM of the first embodiment of the present invention, a power-on completion detecting signal (for example, a power-on reset signal) generated in the interior of the DRAM after the power is turned on can be used for control of the operation start of the second precharging power supply circuit 212, and the precharging current from this second precharging power supply circuit 212 can be added to the precharging current of the first precharging power supply circuit 211 after the power is turned on in the first precharging power supply circuit 211.

That is, control is executed in such a manner that, simultaneously when power is turned on, the first precharging power supply circuit 211 starts to feed the precharging current, and, a predetermined time after the turn-on of power, the second precharging power supply circuit 212 starts to feed the precharging current.

In this case, the period of time from the turn-on of power to the start of the steady operation is relatively long, so that, during the above-mentioned period of time, the operation of the second precharging power supply circuit can be started with a sufficient time-wise margin.

As a result, it becomes possible to realize a synchronous DRAM constituted in such a manner that, when power is turned on, the power-on current is suppressed, while, during steady-state operation, a predetermined precharging current is fed.

Figure 4:
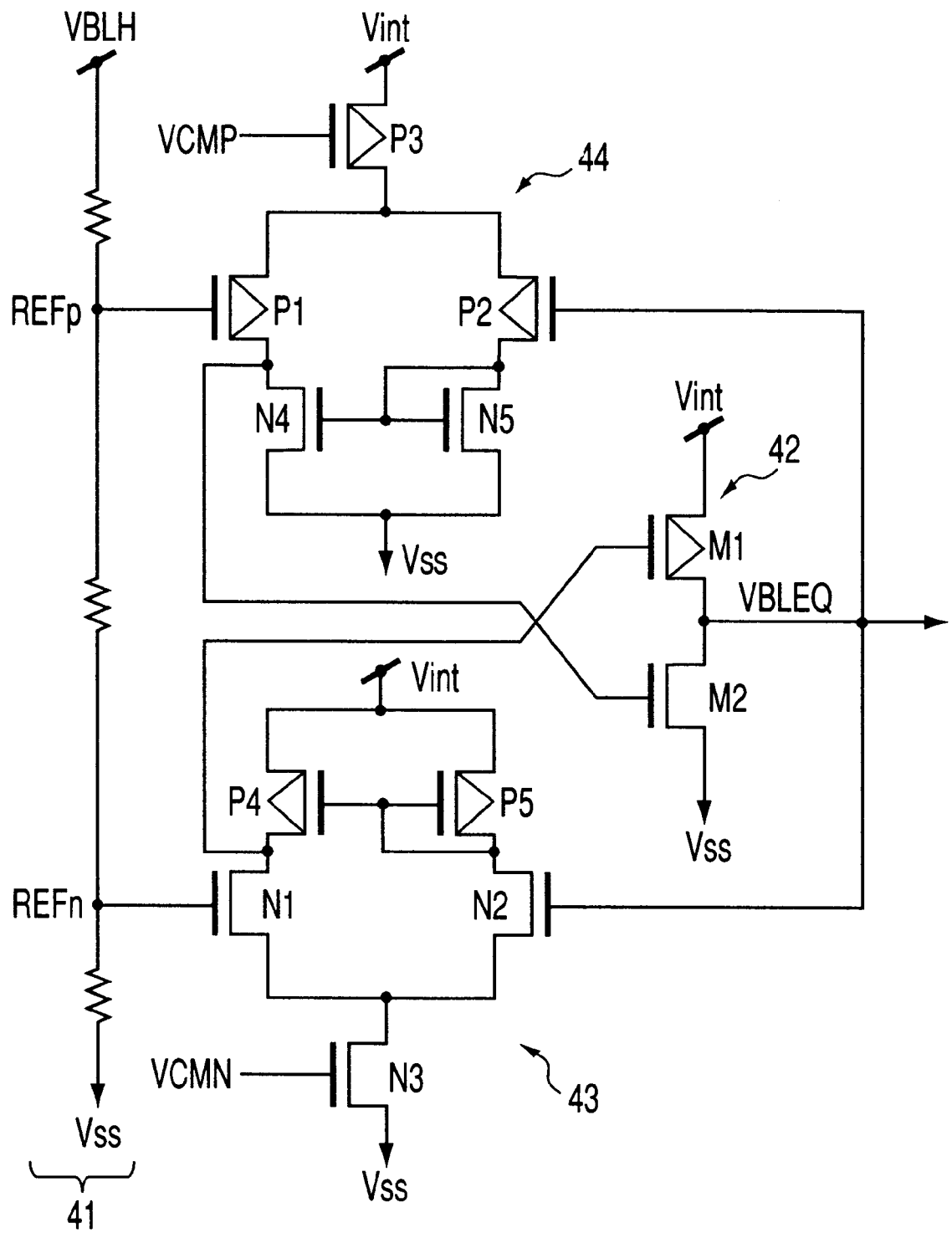
FIG. 4 is a circuit diagram showing a specific example of the first precharging power supply circuit shown in FIG. 1.

FIG. 4 is a circuit diagram showing a specific example of the first precharging power supply circuit 211 shown in FIG. 1.

The precharging power supply circuit 211 shown in FIG. 4 comprises a resistance bleeder circuit 41 which is connected between a Vss node and a first power supply node to which a first power supply potential (VBLH) generated within the DRAM is fed and generates a first reference potential REFn and a second reference potential REFp (>REFn) which potentials differ from each other; a precharging current output circuit 42 which includes a PMOS transistor M1 and an NMOS transistor M2 connected in series between the Vss node and a second power supply node to which a second power supply potential (Vint) generated within the DRAM is fed and which outputs a bit line precharging voltage VBLEQ from the series connection node (output node) of the two transistors M1, M2; a first comparison circuit 43 which compares the first reference potential REFn with the voltage VBLEQ at the output node of the precharging current output circuit 42, outputs an "L" level as the comparison output during the period of REFn>BLEQ, outputs an "H" level as the comparison output during the period of REFn<VBLEQ, and applies the comparison output to the gate of the PMOS transistor M1 in the precharging current output circuit 42; and a second comparison circuit 44 which compares the second reference potential REFp with the voltage VBLEQ at the output node of the precharging current output circuit 42, outputs an "H" level as the comparison output during the period of REFp>VBLEQ, outputs an "L" level as the comparison output during the period of REFp<VBLEQ, and applies the comparison output to the gate of the NMOS transistor M2 in the precharging current output circuit 42.

In other words, the first precharging power supply circuit 211 shown in FIG. 4 comprises a reference voltage generation circuit 41 which divides the voltage of the first internal voltage VBLH generated within the DRAM chip on the basis of an external power supply input and generate a first reference voltage REFn and a second reference voltage REFp which is higher than the first reference voltage REFn; a first transistor M17663 to which the second internal voltage Vint generated within the DRAM chip on the basis of the external power supply input is fed as an operating power and which feeds a precharging current to the bit line precharging power supply lines connected in common; a second transistor M2 for causing current to be discharged from the bit lines; a first voltage comparison circuit 43 to which the second internal voltage Vint is fed as an operating power and which makes comparison between the first reference voltage REFn and the voltage on the bit lines and controls the precharging current feed operation of the first transistor M1 in accordance with the resulting comparison output; and a second voltage comparison circuit 44 to which the second internal voltage Vint is fed as an operating power, makes comparison between the second reference voltage REFp and the voltage on the bit lines, controls the discharge operation of the second transistor M2 in accordance with the comparison output and, thus, controls the voltage on the bit lines to a value below a predetermined value.

The first comparison circuit 43 shown in FIG. 4 comprises input MNOS transistors N1, N2 arranged in such a manner that the first reference voltage REFn and the voltage on the bit line are inputted to the gates thereof corresponding to each other, and the transistors N1, N2 constitute a differential pair with their sources connected in common; an NMOS transistor N3 for current supply which transistor is arranged in such a manner that the drain-source section thereof is connected between the Vss node and the source common-connection node of this differential pair of transistors N1, N2; and PMOS transistors P4, P5 for use as load which transistors are inserted between the power supply node to which the second internal voltage Vint is fed as an operating power and the respective sources of the differential pair of transistors N1, N2 and which are current-mirror-connected, wherein, from the drain of the reference voltage input NMOS transistor N1, the resulting comparison output is taken out.

The second comparison circuit 44 shown in FIG. 4 comprises input PMOS transistors P1, P2 constituted in such a manner that the second reference voltage REFp and the voltage on the bit line are inputted to the gates thereof, corresponding to each other, and the PMOS transistors P1, P2 constitute a differential transistor pair with the respective sources thereof connected in common; a PMOS transistor P3 for current supply arranged in such a manner that the drain-source section thereof is connected between the source common-connecting node of the differential pair transistors and a power supply node to which the second internal voltage Vint is fed as an operating power, and, to the gate thereof, a second bias voltage VCMN is applied; and NMOS transistors N4, N5 for use as a load which transistors are inserted between the Vss node and the respective drains of the differential pair transistors P1, P2, so as to be current-mirror-connected, wherein, from the drain of the reference voltage input MOS transistor P1, the resulting comparison output is taken out.

According to the first precharging power supply circuit 211 shown in FIG. 4, control is executed in such a manner that, when power is turned on, the first voltage comparison circuit 43 makes comparison between the first reference voltage REFn and the voltage VBLEQ on the bit line, so that, by the comparison output during the period of REFn>VBLEQ, the precharging current feed operation of the first transistor M1 can be effected. In this way, the first precharging power supply circuit 211 starts its precharging current feed operation when power is turned on.

Further, the first internal voltage VBLH is normally used as a power supply for the memory core circuit, while the second internal voltage Vint is normally used as a power supply for the peripheral circuits of the memory core, and the voltage VBLEQ on the bit line is normally set to VBLH/2.

Figure 5:
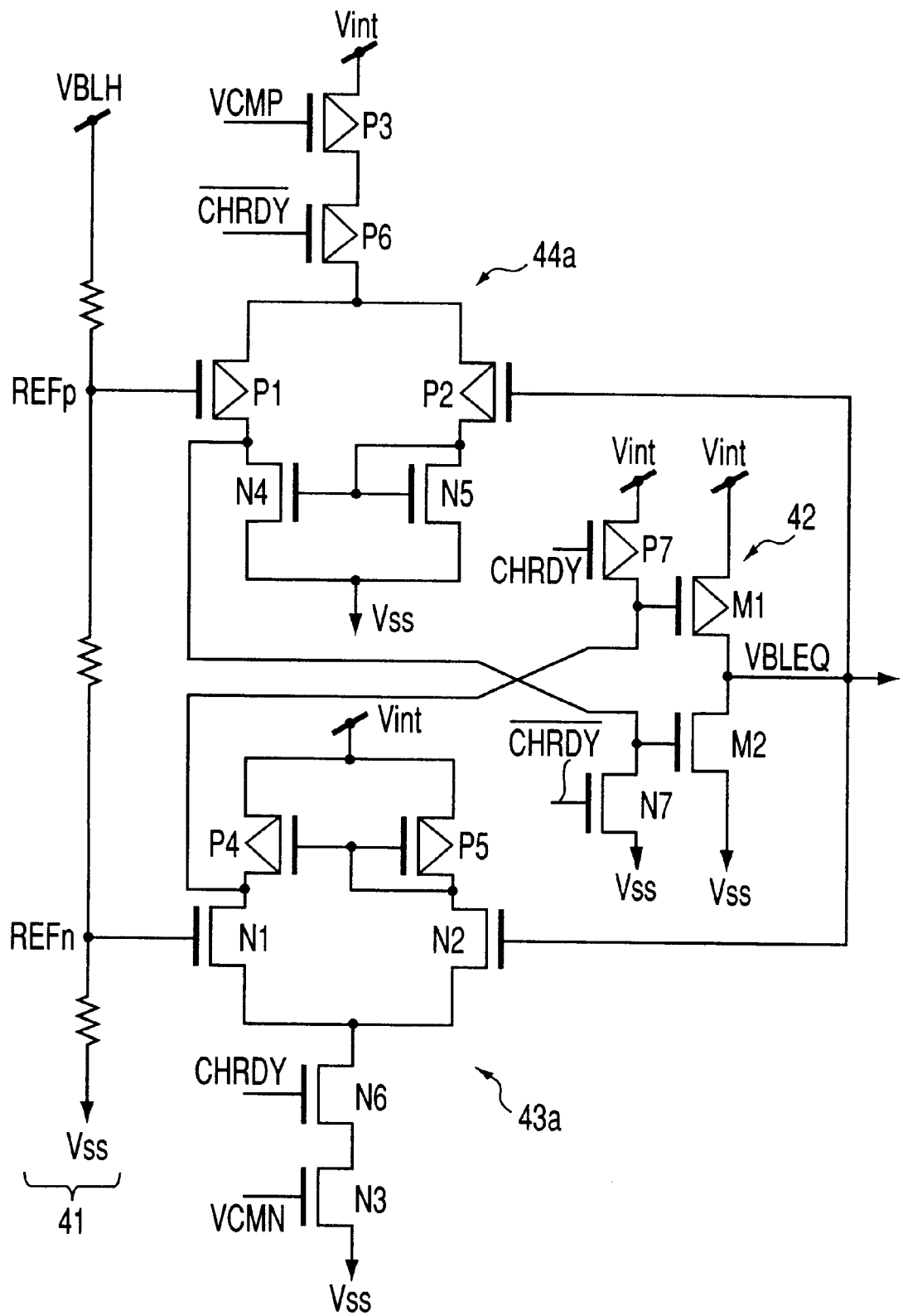
FIG. 5 is a circuit diagram showing a specific example of the second precharging power supply circuit shown in FIG. 1.

FIG. 5 is a circuit diagram showing a specific example of the second precharging power supply circuit 212 shown in FIG. 1.

The second precharging power supply circuit 212 shown in FIG. 5 is the same as the above-mentioned first precharging power supply circuit 211 except for the following points: That is, in case of the second precharging power supply circuit 212, the comparison operation of the first voltage comparison circuit 43a and the second voltage comparison circuit 44a becomes possible upon receipt of a control signal CHRDY (a power-on completion detecting signal such as, e.g., a power-on reset signal) generated after the bit line has risen to a predetermined potential; there is additionally connected a PMOS transistor P7 which prevents the gate of the first transistor M1 from being brought into a floating state to be pulled up to the voltage Vint during the period until the gate voltage of the first transistor M1 comes to be controlled by the comparison output from the first voltage comparison circuit 43a; and an NMOS transistor N7 is additionally connected to prevent the gate potential of the second transistor M2 from being brought into a floating state to be pulled down to the earth potential Vss during the period until the gate potential of the second transistor M2 comes to be controlled by the comparison output from the voltage comparison circuit 44a.

In other words, the first voltage comparison circuit 43a shown in FIG. 5 differs from the first voltage comparison circuit 43 in the first precharging power supply circuit 211 shown in FIG. 4 in the following points: That is, in case of the former, an NMOS transistor N6 is additionally inserted, in series to the current supply transistor N3, between the power supply node and the source common-connecting node of the input transistors N1, N2 constituting a differential pair, and, to the gate of this NMOS transistor N6, the control signal CHRDY is applied. In the other respects, the first voltage comparison circuit 43a shown in FIG. 5 is the same as the first voltage comparison circuit 43 shown in FIG. 4.

Further, the second voltage comparison circuit 44a shown in FIG. 5 differs from the second voltage comparison circuit 44 in the first precharging power supply circuit 211 shown in FIG. 5 in that, between the Vss node and the source common-connecting node of the input transistors P1, P2 which constitute a differential pair, a PMOS transistor P6 is additionally inserted in series to the current supply transistor P3, and, to the gate of this PMOS transistor P6, an inversion signal /CHRDY resulting from the inversion of the control signal CHRDY is applied; but, in the other points, the second voltage comparison circuit 44a shown in FIG. 5 is the same as the second voltage comparison circuit 44 shown in FIG. 4.

That is, the second precharging power supply circuit 212 shown in FIG. 5 comprises a reference voltage generation circuit 41 which divides the first internal power supply VBLM generated within the DRAM chip on the basis of an external power supply input to thereby generate a first reference voltage REFn and a second reference voltage REFp which is higher than the first reference voltage REFn; a first transistor M1 to which a second internal power supply Vint generated within the DRAM chip on the basis of the external power supply input is fed as an operating power and which feeds a precharging current to bit lines connected in common; a second transistor M2 for discharging current from the bit line; and a first voltage comparison circuit 43a to which the second internal voltage Vint is fed as an operating power, and which makes comparison between the first reference voltage REFn and the voltage on the bit line upon receipt of the control signal generated after the bit line has risen to a predetermined potential and controls the precharging current feed operation of the first transistor M1 in accordance with the resulting comparison output; and a second voltage comparison circuit 44a to which the second internal voltage Vint is fed as an operating power, and which, upon receipt of the control signal generated after the bit line has risen to a predetermined potential, makes a comparison between the second reference voltage REFp and the voltage on the bit line to thereby control the discharge operation of the second transistor M2 in accordance with the resulting comparison result, whereby the bit line voltage is controlled to a constant value.

The operation of the precharging power supply circuit 212 shown in FIG. 5 is the same as the bit line precharging current feed operation of the first precharging power supply circuit 211 described above by reference to FIG. 4 except that, in case of the former, comparison operation becomes possible by activation of the control signal CHRDY generated after the bit line has risen to a predetermined potential. In other words, the second precharging power supply circuit 212 is controlled in such a manner that, a predetermined time after the turn-on of power, the feed of the precharging current is started.

Here, a brief description will be given on the operation of independently selecting the respective banks for refreshing them in the synchronous DRAM according to the first embodiment of the present invention.

A self-refresh entry command is inputted in such a manner that, in the state in which a predetermined signal input is set to a predetermined logic level, and a bank address signal BS0 to BSn−1 is determined, the output signal (identical with CLK) from the clock input buffer 11 rises.

A self-refresh exit command is inputted in such a manner that, in the state in which a predetermined signal input is set to a predetermined logic level, and the bank address signal BS0 to BSn−1 is determined, the output signal (identical with CLK) of the clock input buffer 11 rises.

Further, on the basis of the output signal generated when the self-refresh entry command input or the self-refresh exit command input is decoded by the command decoder 13, the control signal generation circuit 14 activates the self-refresh control signal output.

Therefore, in case of entering the self-refresh mode, the self-refresh entry command is inputted with the particular bank, which is to be subjected to the refresh operation, kept in idle state.

In this case, during the period when the CKE signal is "L" in level, the effective bank address signal BSO to Bsn−1 input is taken in, the bank selection circuit 12a decodes the 2-bit bank address signal input BSO, BS1, generates a bank selection signal in the self-refresh mode, and feeds it to the row decoder RD corresponding to the respective bank memories Bank1 to Bank4; and thus, it becomes possible to ensure that a specific bank is selected, and a refresh operation is automatically started in accordance with the distributed refresh method, whereby the stored data can be held over a long period of time.

Further, it is added that, to the bank for which a refresh operation is started as mentioned above, the inputting of a command other than the self-refresh exit command is inhibited.

Further, during the period when this self-refresh mode is under way, the input/output buffers other than the clock input buffer 11 to which the CKE signal is inputted are also brought into enable state, whereby it becomes possible to effect command input in succession.

Since the refresh operation is performed in accordance with distributed refresh method as mentioned above, the overall current consumption can be decreased in view of the cycle time basis.

In case of getting out of the self-refresh mode, a self-refresh exit command is inputted by setting various signal inputs. In this case, during the period when the CKE signal is in "L" level, the effective bank address signal input BSO to BSn−1 is taken in and decoded, so that the bank selection signal is reset, and therefore, a specific bank is selected with which the refresh operation can be terminated (returning to the normal operating mode).

Figure 6:
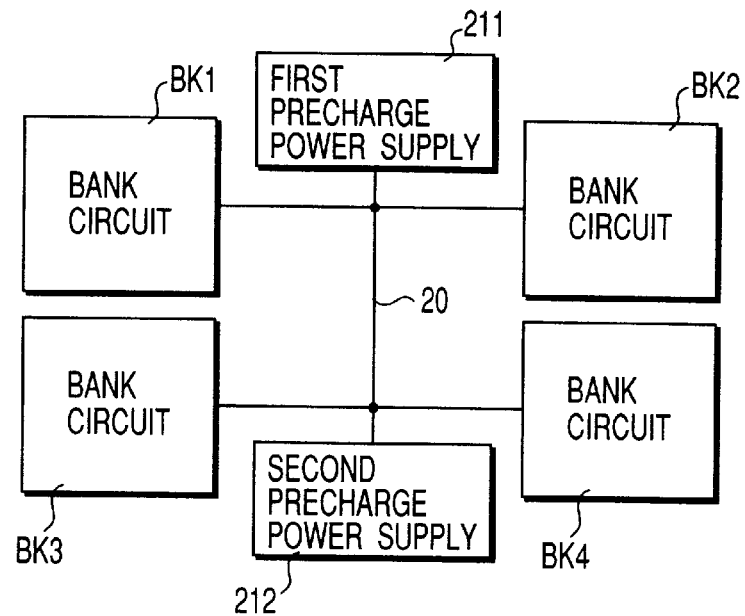
FIG. 6 is a pattern layout diagram showing an example of the positional relationship between the four banks and the two precharging power supply circuits shown in FIG. 1.

FIG. 6 is a pattern layout diagram showing an example of the positional relationship between the four bank circuits BKi and the two precharging power supply circuits 211, 212.

In case the four bank circuits BKi are disposed in two rows and two columns, the first precharging power supply circuit 211 is disposed between the two bank circuits on the first row, while the second precharging power supply circuits 212 is disposed between the two bank circuits on the second row.

In this case, the bank circuits BK1, BK2 and the precharging power supply circuit 211 on the first row and the bank circuits BK3, BK4 and the precharging power supply circuit 212 on the second row are disposed line-symmetrically with reference to the inter-row horizontal line (not shown). Due to this pattern arrangement, the distances from the precharging power supply circuits 211, 212 to the respective banks become approximately equal, and thus, during steady-state operation, the respective bank circuits are precharge-driven approximately uniformly.

In the foregoing first embodiment of the present invention, the precharging control of the bit lines is executed, but, not only the bit lines, but other precharged signal lines such as the capacitor plate lines can also be precharge-controlled in the same manner as in case of the first embodiment.

<Modification of the First Embodiment>

By providing three or more precharging power supply circuits and executing control so as to optionally distribute the timings for staring the respective operation, the same effect as that of the first embodiment of the present invention can be achieved.

Figure 7:
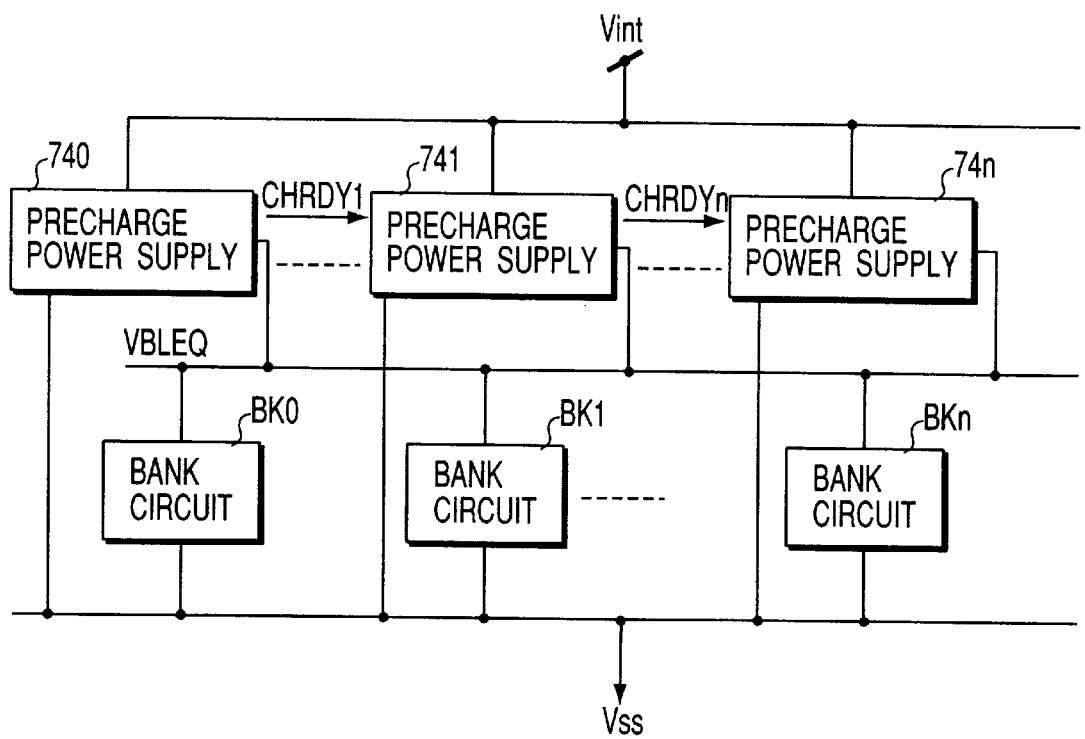
FIG. 7 is an equivalent circuit diagram showing an example of the circuit connection between the banks and the precharging power supply circuits in the synchronous DRAM according to a modification of the first embodiment of the present invention.

FIG. 7 is an equivalent circuit diagram showing an example of the circuit connection between the bank circuits and the precharging power supply circuits in the synchronous DRAM according to a modification of the first embodiment of the present invention.

In this synchronous DRAM, control is executed in such a manner that, in case n precharging power supply circuits 740 to 74n are provided in association with n bank circuits BK0 to BKn, the roles of the precharging power supply circuits are shared in such a manner that at least one first precharging power supply circuit starts to operate when power is turned on, while a plurality of second precharging power supply circuits start to operate later than the first precharging power supply circuit.

In this case, the control may alternatively be executed in such a manner that the plurality of second precharging power supply circuits start to operate at the same time after the bit lines are raised to a predetermined potential through the precharge effected by the first precharging power supply circuit, or they are made to start their operation one after another by the control signals CHRDY1 to CHRDYn.

<Second Embodiment>

Figure 8:
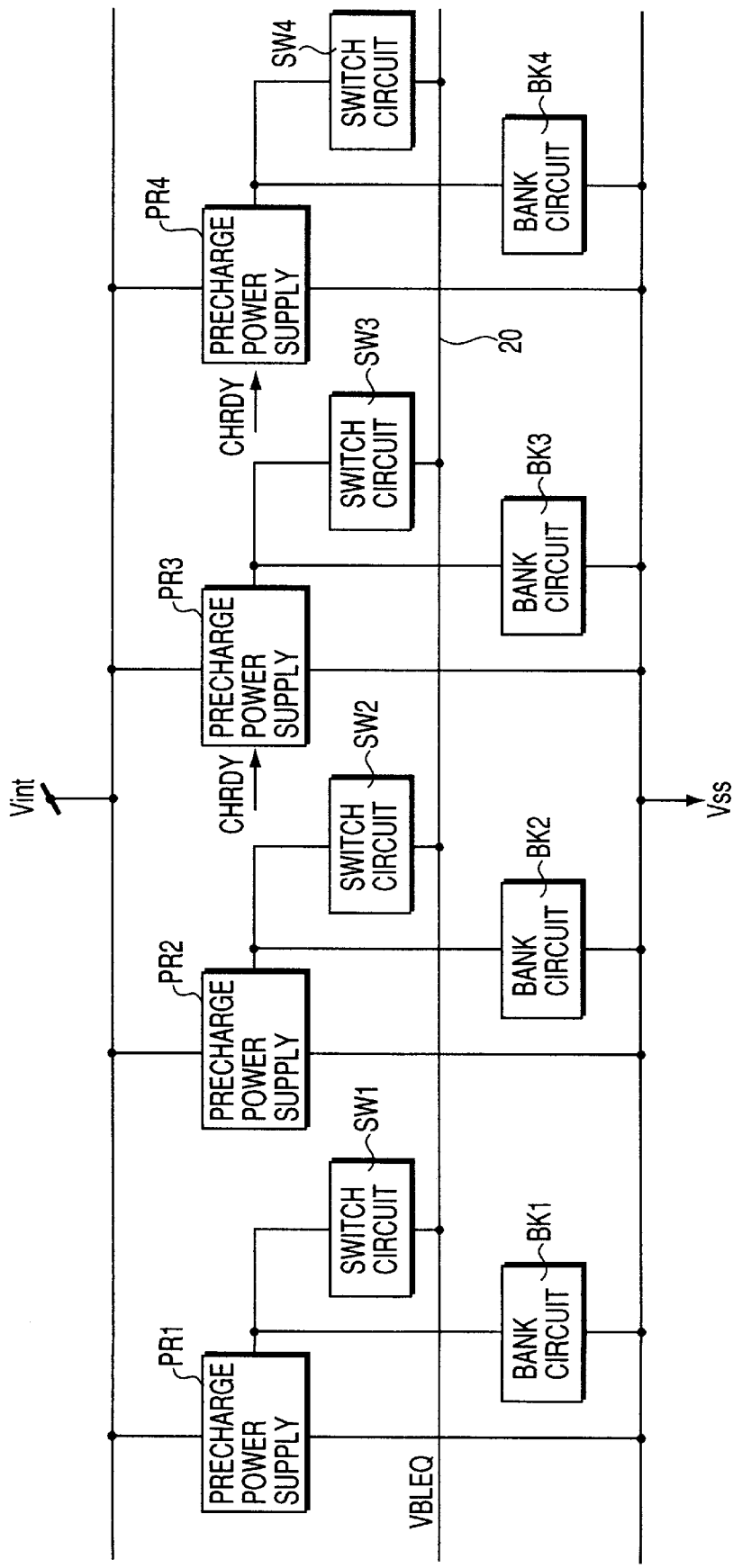
FIG. 8 is an equivalent circuit diagram showing an example of the essential portion of the synchronous DRAM according to a second embodiment of the present invention.

FIG. 8 is an equivalent circuit diagram showing the essential portion of the synchronous DRAM according to a second embodiment of the present invention.

The second embodiment of the present invention is constituted by modifying the first embodiment in such a manner that, when power is turned on, a precharging current is fed in common to the bit lines of the respective bank memories, and, during steady-state operation, the precharging current is fed to the bit lines of the respective bank memories by electrically separating the bit lines from one another, whereby the occurrence of interference noises among the banks during steady-state operation can be prevented.

Referring to FIG. 8, precharging power supply circuits PRi and switch circuits SWi are provided, respectively, corresponding to a plurality of bank circuits BKi (i=1 to 4).

The respective switch circuits SWi are controlled into OFF state a predetermined time after the power is turned on in the DRAM chip. The switch circuits SWi are arranged in such a manner that one-side ends thereof are connected to the bit line precharging power supply lines of the corresponding bank circuit BKi, while the other-side ends thereof are connected to a common connection line 20.

Further, the respective precharging power supply circuits PRi are arranged in such a manner that the precharging current output nodes thereof are connected to the bit line precharging power supply lines of the corresponding bank circuits BKi.

In this case, some (PR1 and PR2, in this embodiment) of the precharging power supply circuits start their precharging current feed operation when the power supply of the DRAM chip is turned on, and the remaining precharging power supply circuits (PR3 and PR4, in this embodiment) are controlled so as to start their precharging current feed operation after the bit lines have been raised to a predetermined potential by the precharging current from the precharging power supply circuits.

In other word, the synchronous DRAM according to the second embodiment of the present invention comprises a plurality of bank circuits BKi which have precharging power supply lines, respectively; a plurality of switch circuits SWi which are provided corresponding to the plurality of bank circuits, each have one-side end connected to the precharging power supply line of the corresponding bank circuit, and are controlled into an OFF state a predetermined time after the power supply of the DRAM chip is turned on; a common connection line 20 connected in common to the respective other-side ends of the plurality of switch circuits; and a plurality of precharging power supply circuits PRi which are provide corresponding to the plurality of bank circuits and whose precharging current output nodes are connected to the precharging power supply lines of the corresponding bank circuits, wherein the plurality of precharging power supply circuits PRi consist mixedly of first precharging power supply circuits which start their precharging current feed operation when the power supply in the DRAM chip is turned and of second precharging power supply circuits which start their precharging current feed operation after the bit lines have been raised to a predetermined potential by the precharging current of the first precharging power supply circuits.

FIGS. 9A and 9B show two different examples of the switch circuits SWi shown in FIG. 8.

The switch circuit shown in FIG. 9A comprises an NOMS transistor TN inserted in series into the precharging current feed route and a control gate which controls the NMOS transistor TN so as to be kept in ON state until the control signal CHRDY is activated (rendered into "H" level) and then controls the NMOS transistor TN into OFF state after the control signal CHRDY has been activated.

Used as this control gate is for example a NAND gate NG to which the control signal CHRDY and a gate passage allowing/inhibiting control signal /FUSE are inputted. The output from this NAND gate NG is applied to the gate of the NMOS transistor TN.

If it is assumed that, as the gate passage allowing/inhibiting control signal /FUSE, there is used a signal which is kept in "H" level before a specific fuse element is blown out but brought into "L" level after the fuse is blown out, then the NAND gate NG operates as an inverter circuit when the control signal /FUSE is "H" in level, so that the ON/OFF state of the NMOS transistor TN is controlled in accordance with the logic level of the control signal CHRDY, and, when the control signal /FUSE is "L" in level, the output of the NAND gate NG is fixed to "H" level, so that the NMOS transistor TN is controlled so as to be kept in ON state regardless to the logic level of the control signal CHRDY.

The switch circuit shown in FIG. 9B comprises a PMOS transistor TP inserted in series into the precharging current feed route and a control gate which controls the PMOS transistor TP so as to be kept in ON state until the control signal CHRDY is activated (rendered "H" in level) and controls the PMOS transistor TP so as to be kept in OFF state after the control signal CHRDY is activated.

Used as this control gate are an NAND gate NG to which the control signal CHRDY and the gate passage allowing/inhibiting control signal /FUSE are inputted and an inverter circuit IV which inverts the output of this NAND gate NG. The output from this inverter circuit IV is applied to the gate of the PMOS transistor TP.

When the gate passage allowing/inhibiting control signal /FUSE is in "H" level, the NAND gate NG operates as an inverter circuit, so that the ON/OFF state of the PMOS transistor TP is controlled in accordance with the logic level of the control signal CHRDY, while, when the control signal /FUSE is in "L" level, the output from the NAND gate NG is fixed in "H" level, and the output from the inverter circuit id fixed "L" level, so that the PMOS transistor TP is controlled into ON state regardless to the logic level of the control signal CHRDY.

According to the above-described synchronous DRAM of the second embodiment of the present invention, the switch circuits SWi are in ON state when power is turned on, so that some precharging power supply circuits which start their precharging current feed operation feed the precharging current to the respective bank circuits, while, during steady-state operation, the switch circuits SWi are in OFF state, so that, to the respective bank circuits, the precharging current is fed from the corresponding precharging power supply circuits PRi.

That is, in case of the second embodiment of the present invention, the switch circuits SWi are provided corresponding to the respective bank circuits BKi, whereby, when power is turned on, the precharging current is fed in common to the bit liens of the respective bank circuits, while, during steady-state operation, the bit lines of the respective bank circuits are electrically separated from one another, and the precharging current is fed to the thus electrically separated bit lines.

Therefore, not only the power-on current can be suppressed as in the case of the first embodiment, but also the occurrence of interference noises among the banks during steady-state operation can be prevented, and thus, the read operation of the memory cells can be stabilized.

FIG. 10 is a pattern layout diagram showing an example of the positional relationship among the bank circuits BKi, the switch circuits SWi and the precharging power supply circuits PRi shown in FIG. 8.

In case that four bank circuits BKi are disposed in a two-row and two-column arrangement, between the two bank circuits on the first row, a precharging power supply circuit PR1 and a switch circuit SW1 are disposed in the vicinity of one of the two bank circuits, while, in the vicinity of the other bank circuit, the precharging power supply circuit PR2 and the switch circuit SW2 are disposed.

Further, as in the case mentioned above, the precharging power supply circuit PR3 and the switch circuit SW3 are disposed between the two bank circuits on the second row and in the vicinity of the one of the two bank circuits, while, in the vicinity of the other bank circuit, the precharging power supply circuit PR4 and the switch circuit SW4 are disposed.

In this case, the bank circuits and the precharging power supply circuits on the first row and the bank circuits and the precharging power supply circuits on the second row are disposed line-symmetrically with reference to an inter-row horizontal line (not shown), and further, the bank circuits and the precharging power supply circuits on the first column and the bank circuits and the precharging power supply circuits on the second column are disposed line-symmetrically with reference to an inter-column vertical line (not shown).

Due to this pattern arrangement, the distances from the respective precharging power supply circuits to the respective corresponding bank circuits are approximately equal. Thus, during steady-state operation, these bank circuits are precharge-driven approximately uniformly.

<Modification of the Second Embodiment>

This modification is constituted in such a manner that the switch circuits are not provided corresponding to the respective bank circuits, the precharging power supply circuits are connected corresponding to the respective bank circuits, whereby it becomes possible to electrically separate the bit lines of the respective bank circuits from one another during steady-state operation and feed the precharging current to them in the thus electrically separated state, and thus, it becomes possible to prevent the occurrence of interference noises among the bank circuits during steady-state operation.

<Third Embodiment>

Figure 11:
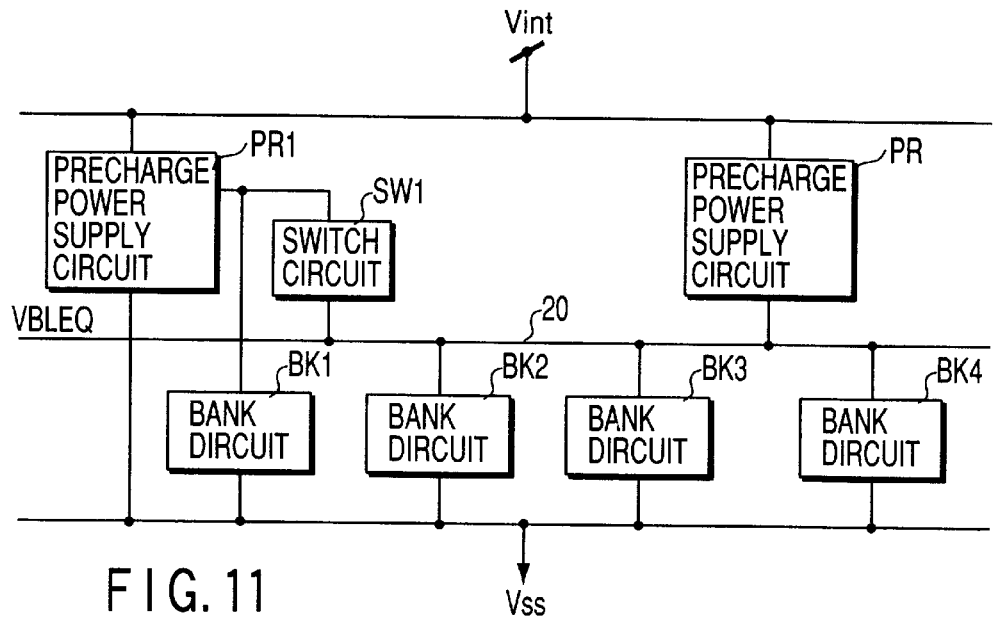
FIG. 11 is an equivalent circuit diagram showing the essential portion of the synchronous DRAM according to a third embodiment of the present invention.
Figure 12:
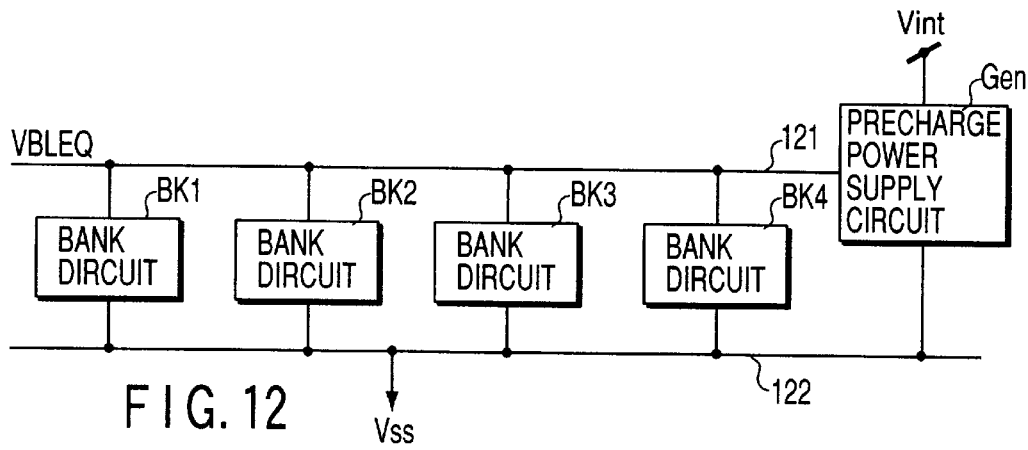
FIG. 12 is an equivalent circuit diagram showing an example of the circuit connection between the banks and the precharging power supply circuit in a conventional synchronous DRAM which comprises a multi-bank structure.
Figure 13:
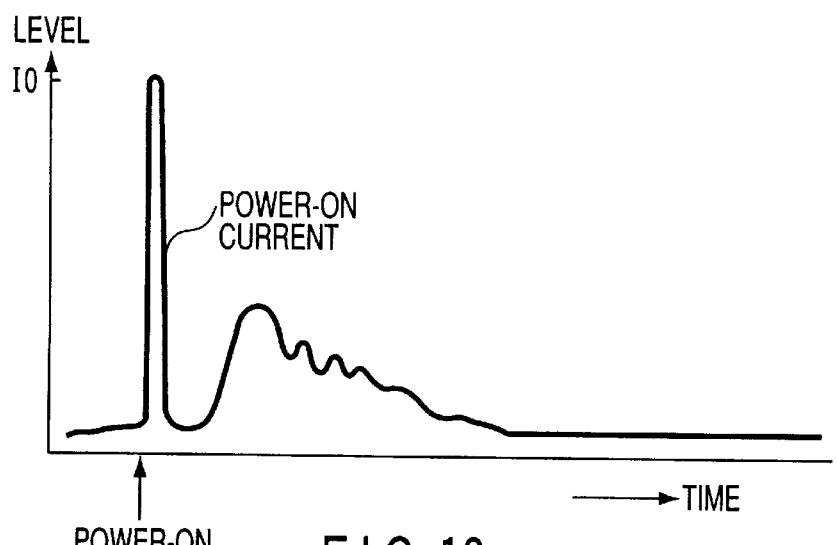
FIG. 13 is a timing waveform diagram for explaining the precharging current feed operation of the precharging power supply circuit in the synchronous DRAM shown in FIG. 12.

FIG. 11 shows an equivalent circuit of the essential portion of the synchronous DRAM according to a third embodiment of the present invention. The third embodiment of the present invention is constituted by modifying the second embodiment of the present invention, which has been described above by reference to FIG. 8, in such a manner that, with reference to only some of the bank circuits (e.g., BK1), the switch circuit SW1 and the precharging power supply circuit PR1, which starts its precharging current feed operation when power is turned on, are connected to the bit line precharging power supply line of the bank circuit BK1, while, to the bit lines of all the remaining bank circuits, one or a plurality of precharging current supply circuits PR which start the precharging current feed operation a predetermined time after the power is turned on are connected in common. In FIG. 11, the same constituent portions as those shown in FIG. 8 are referenced by the same reference symbols.

According to the third embodiment of the present invention, it is possible to feed the precharging current in common to the bit lines of the respective banks circuits when power is turned on and feed the precharging current to the bit lines by electrically separating the bit line of some bank circuit from the bit lines of the remaining bank circuits, whereby the occurrence of interference noises among the banks during steady-state operation can be prevented.

In particular, recently as the DRAMs are more and more increased in capacity, the power-on current tends to be increased in case of the conventional technique, so that, in case of applying the present invention to the DRAMs of the 64-Mbit generation or more-bit generation, the present invention can exhibit all the more marked effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising
   a plurality of circuit blocks arranged in such a manner that precharging power supply lines which the circuit blocks have, respectively, are connected in common, and the circuit blocks are all of the same structure,
   a first precharging power supply circuit arranged in such a manner that a precharging current output node thereof is connected to the precharging power supply line, and the first precharging power supply circuit starts its precharging current feed operation when the power supply in the semiconductor chip is turned on, and
   a second precharging power supply circuit arranged in such a manner that a precharging current output node thereof is connected to the precharging power supply line, and the second precharging power supply circuit starts its precharging current supply operation after the precharging power supply line has been raised to a predetermined potential by the precharging current of the first precharging power supply circuit.

2. A semiconductor device according to claim 1, wherein the second precharging power supply circuit comprises
   a reference voltage generation circuit which generates a first reference voltage on the basis of an external power supply input,
   a first transistor to which an internal voltage generated within the semiconductor chip on the basis of the external power supply input is fed as an operating power, the first transistor feeding a precharging current to the precharging power supply line, and
   a first comparison circuit to which the internal voltage is fed as an operating power, the first comparison circuit making a comparison between the first reference voltage and the voltage on the precharging power supply line upon receipt of a control signal generated after the precharging power supply line has risen to a predetermined potential and thus controlling the precharging current feed operation of the first transistor circuit in accordance with the resulting comparison output.

3. A semiconductor device according to claim 2, wherein the reference voltage generation circuit further generates a second reference voltage which is larger than the first reference voltage, and further comprising
   a second transistor for discharging current from the precharging power supply line, and
   a second voltage comparison circuit which makes comparison between the second reference voltage and the voltage on the precharging power supply line to thereby control the discharge operation of the second transistor in accordance with the resulting comparison output.

4. A semiconductor device according to claim 1, wherein the pattern-wise positional relationship between the plurality circuit blocks and the precharging power supply circuits is approximately symmetrical each circuit-block-wise.

5. A semiconductor device according to claim 1, wherein the semiconductor device is a synchronous dynamic random access memory constituted in such a manner that the memory cell array and the circuits associated therewith are divided into a plurality of banks, which can be independently selected, and
   the precharging power supply lines of the respective banks are the bit lines or capacitor plate lines of the cell array.

6. A semiconductor device comprising
   a plurality of circuit blocks which each have a precharging power supply line,
   a plurality of switch circuits which are provided corresponding to the plurality circuit blocks, each have one end thereof connected to the precharging power supply line of the corresponding circuit block, and are controlled into OFF state a predetermined time after the power supply in the semiconductor chip is turned on,
   a common precharging power supply line connected in common to the other ends of the polarity of switch circuits, and
   a plurality of precharging power supply circuits which are provided corresponding to the plurality of circuit blocks, and each have its precharging current output node connected to the precharging power supply line of the corresponding circuit block,
   wherein the plurality of precharging power supply circuits consist of first precharging power supply circuits which start their precharging current feed operation when the power supply in the semiconductor chip is turned on and of second precharging power supply circuits which start their precharging current feed operation after the precharging power supply lines have been raised to a predetermined potential by the precharging current from the first precharging power supply circuits.

7. A semiconductor device according to claim 6, wherein the pattern-wise positional relationship between the plurality circuit blocks and the precharging power supply circuits is approximately symmetrical each circuit-block-wise.

8. A semiconductor device according to claim 6, wherein the semiconductor device is a synchronous dynamic random access memory constituted in such a manner that the memory cell array and the circuits associated therewith are divided into a plurality of banks, which can be independently selected, and the precharging power supply lines of the respective banks are the bit lines or capacitor plate lines of the cell array.

9. A semiconductor device comprising a plurality of circuit blocks which each have a precharging power supply line, switch circuits which are connected at one-side ends thereof to the precharging power supply lines of specific first circuit block of the plurality of circuit blocks and connected in common at the other-side end thereof and are controlled into OFF state a predetermined time after the power supply in the semiconductor chip is turned on, a common precharging power supply line connected in common to the precharging power supply lines of the second circuit blocks other than the first circuit blocks and to the other-side ends of the switch circuits, a first precharging power supply circuit which has its precharging current output node connected to the precharging power supply lines of the first circuit blocks, and a second precharging power supply circuit which has its precharging current output node connected to the precharging power supply lines of the second circuit blocks, wherein, of the first precharging power supply circuit and the second precharging power supply circuit, one precharging power supply circuit starts its precharging current feed operation when the power supply in the semiconductor chip is turned on, while the other precharging power supply circuit starts its precharging current feed operation after the precharging power supply lines have been raised to a predetermined potential by the precharging current of the one precharging power supply circuit.

10. A semiconductor device according to claim 9, wherein the semiconductor device is a synchronous dynamic random access memory constituted in such a manner that the memory cell array and the circuits associated therewith are divided into a plurality of banks, which can be independently selected, and the precharging power supply lines of the respective banks are the bit lines or capacitor plate lines of the cell array.

11. A semiconductor device according to claim 1, further comprising:

a clock input buffer to which a clock signal and a control signal are inputted;

an address input buffer to which address signals and circuit block address signals are inputted, for amplifying the address signals and circuit block address signals in synchronism with an output signal from the clock input buffer, the address input buffer including a circuit block selection circuit which decodes an inputted circuit block address signal to generate a circuit block selection signal;

a command decoder to which external control signals are inputted as operation mode designating commands, the command decoder for decoding the external control signals in synchronism with the output signal from the clock input buffer;

a circuit block selection circuit in a self-refresh mode for receiving the circuit block selection signal outputted from the address input buffer and generating a circuit block selection signal in a self-refresh mode;

a control signal generation circuit to which an decode output signal outputted from the command decoder is inputted, for generating internal control signals in synchronism with the output signal from the clock input buffer;

refresh counters for generating refresh address signals; and address latch circuits which latch one of an output signal from the address input buffer and an output signal from the refresh counters, in accordance with whether the operation mode is a normal operation mode or a self-refresh mode.

* * * * *